(12) United States Patent
Zeng et al.

(10) Patent No.: US 11,491,933 B2
(45) Date of Patent: Nov. 8, 2022

(54) INTEGRATED CONTROLLER OF VEHICLE AND VEHICLE

(71) Applicant: BYD COMPANY LIMITED, Guangdong (CN)

(72) Inventors: Lulin Zeng, Shenzhen (CN); Axi Qi, Shenzhen (CN); Cunlong Liu, Shenzhen (CN); Qiwei Zhan, Shenzhen (CN); Youxin Zhang, Shenzhen (CN)

(73) Assignee: BYD COMPANY LIMITED, Guangdong (CN)

( * ) Notice: Subject to any disclaimer, the term of this patent is extended or adjusted under 35 U.S.C. 154(b) by 24 days.

(21) Appl. No.: 17/261,635

(22) PCT Filed: Jul. 26, 2019

(86) PCT No.: PCT/CN2019/097901
§ 371 (c)(1),
(2) Date: Jan. 20, 2021

(87) PCT Pub. No.: WO2020/020345
PCT Pub. Date: Jan. 30, 2020

(65) Prior Publication Data
US 2021/0261074 A1 Aug. 26, 2021

(30) Foreign Application Priority Data
Jul. 27, 2018 (CN) .......................... 201810847799.6

(51) Int. Cl.
*H05K 7/20* (2006.01)
*B60R 16/023* (2006.01)
(Continued)

(52) U.S. Cl.
CPC ............ *B60R 16/0231* (2013.01); *B60K 1/02* (2013.01); *B60L 1/00* (2013.01); *B60L 15/00* (2013.01);
(Continued)

(58) Field of Classification Search
CPC .......... B60L 1/003; B60L 50/51; B60L 15/20; B62D 5/046; B60R 16/0231; B60R 16/03;
(Continued)

(56) References Cited

U.S. PATENT DOCUMENTS

2010/0116570 A1* 5/2010 Sugawara ............... B60L 58/16
429/82
2018/0099692 A1* 4/2018 Oya ..................... B62D 15/025

FOREIGN PATENT DOCUMENTS

CN 103661167 A 3/2014
CN 204264059 U 4/2015
(Continued)

OTHER PUBLICATIONS

International Search Report for Application No. PCT/CN2019/097901, dated Nov. 1, 2019, 6 pages.

*Primary Examiner* — Mandeep S Buttar

(57) ABSTRACT

An integrated controller (A) for a vehicle, and a vehicle (B), where the integrated controller (A) includes a box body (10), a high-voltage power distribution module (900) disposed in the box body (10), and a left driving motor controller (300), a right driving motor controller (400), an air compressor motor controller (500), a steering motor controller (600), and a DC-DC voltage converter (700) that are all connected to the high-voltage power distribution module (900); and the box body (10) is provided with a plurality of input/output interfaces corresponding to the high-voltage power distribution module (900), the left driving motor controller (300), the right driving motor controller (400), the air compressor motor controller (500), the steering motor controller (600), and the DC-DC voltage converter (700).

14 Claims, 10 Drawing Sheets

(51) Int. Cl.
  *B60L 50/60* (2019.01)
  *B60L 53/16* (2019.01)
  *G01R 31/52* (2020.01)
  *B60K 1/02* (2006.01)
  *B60L 1/00* (2006.01)
  *B60L 15/00* (2006.01)
  *H05K 5/00* (2006.01)

(52) U.S. Cl.
  CPC .............. *B60L 50/66* (2019.02); *B60L 53/16* (2019.02); *B60R 16/0238* (2013.01); *B60R 16/0239* (2013.01); *G01R 31/52* (2020.01); *H05K 5/0017* (2013.01); *H05K 7/20272* (2013.01); *H05K 7/20872* (2013.01); *H05K 7/20927* (2013.01); *B60L 2210/10* (2013.01)

(58) Field of Classification Search
  CPC .. G06F 1/3287; H05K 7/1432; H05K 5/0017; H05K 7/20272; G05D 1/0891; H02K 11/33; H02K 5/20
  USPC .............................. 361/699; 180/65.1; 701/1
  See application file for complete search history.

(56) References Cited

FOREIGN PATENT DOCUMENTS

| | | |
|---|---|---|
| CN | 204323097 U | 5/2015 |
| CN | 204567344 U | 8/2015 |
| CN | 204956151 U | 1/2016 |
| CN | 106080443 A | 11/2016 |
| CN | 205871953 U | 1/2017 |
| CN | 206155349 U | 5/2017 |
| CN | 207549983 U | 6/2018 |
| CN | 108248447 A | 7/2018 |
| CN | 208855438 U | 5/2019 |
| JP | H10501680 A | 2/1998 |
| JP | 2005057928 A | 3/2005 |
| JP | 2016171672 A | 9/2016 |
| WO | 2012/033254 A1 | 3/2012 |

\* cited by examiner

US 11,491,933 B2

INTEGRATED CONTROLLER OF VEHICLE AND VEHICLE

CROSS-REFERENCE TO RELATED APPLICATIONS

This application is a national phase application of International Patent Application No. PCT/CN2019/097901, filed with the China National Intellectual Property Administration (CNIPA) on Jul. 26, 2019, which is based on and claims priority to and benefits of Chinese Patent Application No. 201810847799.6 filed on Jul. 27, 2018 with the CNIPA. The content of all of the above applications is incorporated herein by reference in their entirety.

FIELD

The present disclosure relates to the technical field of vehicles, and specifically, to an integrated controller for a vehicle, and a vehicle.

BACKGROUND

In the related art, controller modules in a high-voltage system of a vehicle operate independently, and the controller modules realize the operation of the whole vehicle through a switching wire harness. Because the controller modules operate independently and the modules are connected through the wire harness, the cost is high and the assembly difficulty of the whole vehicle is increased for detecting which modules have faults or are aging.

SUMMARY

The present disclosure provides an integrated controller for a vehicle, and a vehicle, to resolve the technical problems in the related art of high detection cost and an increased assembly difficulty of a whole vehicle, due to that controller modules in a high-voltage system of the vehicle operate independently and are connected through a wire harness to realize the operation of the whole vehicle.

To achieve the objective above, a first aspect of embodiments of the present disclosure provides an integrated controller for a vehicle, including a box body, a high-voltage power distribution module disposed in the box body, and a left driving motor controller, a right driving motor controller, an air compressor motor controller, a steering motor controller, and a DC-DC voltage converter that are all connected to the high-voltage power distribution module, where the box body is provided with a plurality of input/output interfaces corresponding to the high-voltage power distribution module, the left driving motor controller, the right driving motor controller, the air compressor motor controller, the steering motor controller, and the DC-DC voltage converter.

In some embodiments, the box body includes an upper box body and a lower box body; the left driving motor controller and the right driving motor controller are mounted in the upper box body; the air compressor motor controller, the steering motor controller, and the DC-DC voltage converter are mounted in the lower box body; the upper box body and the lower box body are each internally provided with the high-voltage power distribution module; and the upper box body is provided with battery pack interfaces and charging connector interfaces that are all connected to the high-voltage power distribution module.

In some embodiments, the upper box body is provided with at least two battery pack interfaces and at least two charging connector interfaces.

In some embodiments, a connection circuit between the battery pack interfaces and the high-voltage power distribution module, and a connection circuit between the charging connector interfaces and the high-voltage power distribution module are each provided with a magnetic ring and a Y capacitor.

In some embodiments, the upper box body is further internally provided with an electric leakage sensor connected to the high-voltage power distribution module, and the upper box body is provided with an input/output interface corresponding to the electric leakage sensor.

In some embodiments, the upper box body is further internally provided with an optical coupler sintering detector connected to the high-voltage power distribution module, and the upper box body is provided with an input/output interface corresponding to the optical coupler sintering detector.

In some embodiments, a first cooling water channel and a second cooling water channel independent of each other are provided between the upper box body and the lower box body; heat of the right driving motor controller, the air compressor motor controller, and the steering motor controller is dissipated through the first cooling water channel; and heat of the left driving motor controller and the DC-DC voltage converter is dissipated through the second cooling water channel.

In some embodiments, the upper box body includes an upper box body bottom wall and an upper box body side wall formed around the upper box body bottom wall; a first cooling water trough and a second cooling water trough independent of each other are formed on a lower surface of the upper box body bottom wall; the lower box body includes a lower box body top wall and a lower box body side wall formed around the lower box body top wall; a third cooling water trough and a fourth cooling water trough independent of each other are formed on an upper surface of the lower box body top wall; and the lower surface of the upper box body bottom wall is attached to the upper surface of the lower box body top wall, so that the first cooling water trough and the fourth cooling water trough together define the first cooling water channel, and the second cooling water trough and the third cooling water trough together define the second cooling water channel.

In some embodiments, the upper box body and the lower box body are connected through bolts and friction welding.

In some embodiments, the air compressor motor controller, the steering motor controller, and the DC-DC voltage converter are in contact with the lower box body top wall.

In some embodiments, two openings running through the upper box body bottom ware all formed in the upper box body bottom wall; the left driving motor controller is disposed on one opening, so that a heat dissipation column of the left driving motor controller is in contact with a coolant in the second cooling water channel; and the right driving motor controller is disposed on the other opening, so that a heat dissipation column of the right driving motor controller is in contact with a coolant in the first cooling water channel.

In some embodiments, a reinforcing rib is formed in the opening; the two ends of the reinforcing rib are connected to a pair of side edges of the opening; and the reinforcing rib is perpendicular to a flow direction of the coolant.

In some embodiments, a boss is formed on the upper surface of the lower box body top wall at a position corresponding to the opening; a shape of the boss fits that of the opening; and a receiving slot for receiving the reinforcing rib is formed on the boss.

In some embodiments, the coolant in the first cooling water channel first cools the steering motor controller, and then cools the air compressor motor controller and the right driving motor controller; and the coolant in the second cooling water channel first cools the DC-DC voltage converter, and then cools the left driving motor controller.

In some embodiments, the first cooling water channel and the second cooling water channel are symmetrically arranged.

A second aspect of the embodiments of the present disclosure provides a vehicle, where the vehicle includes the integrated controller according to any item in the aforementioned first aspect.

By using the foregoing technical solutions, at least the following technical effects can be achieved.

Integrating the left driving motor controller, the right driving motor controller, the air compressor motor controller, the steering motor controller, the DC-DC voltage converter, and the high-voltage power distribution module in the box body optimizes the arrangement space of the whole vehicle, and reduces the development cost. These modules are all integrated in the box body, and may be connected through a switching copper bar, which facilitates, as compared with wire harness connection, detecting which modules are aging and reducing the cost, and also facilitates replacing the modules in the box body. For example, the modules corresponding to different vehicle types are replaced for use in dozens of types of vehicle. Therefore, the present disclosure realizes controller platformization, and resolves the technical problems in the related art of high detection cost and an increased assembly difficulty of a whole vehicle due to that controller modules in a high-voltage system of the vehicle operate independently and are connected through a wire harness to realize the operation of the whole vehicle. In addition, integrating the left driving motor controller and the right driving motor controller realizes wheel drive or single motor drive of the whole vehicle. Moreover, integrating the high-voltage power distribution module in the box body enables wearing parts in the high-voltage power distribution module, such as a discharging fuse, a main fuse, and a pre-charging resistor, to be replaced on the whole vehicle without returning the integrated controller to a manufacturer for replacement, thereby further saving the costs.

Other features and advantages of the present disclosure will be described in detail in the following specific implementation.

BRIEF DESCRIPTION OF THE DRAWINGS

The accompanying drawings are provided to further understand the present disclosure, and constitute a part of this specification. The accompanying drawings, along with the detailed description below, are used to explain the present disclosure, and do not constitute a limitation to the present disclosure. In the accompanying drawings.

DESCRIPTION OF REFERENCE NUMERALS

A. Integrated controller;
B. Vehicle;
A1. First cooling water channel;
A2. Second cooling water channel;
B1. First water pump;
B2. Second water pump;
10. Box body;
900. High-voltage power distribution module;
100. Upper box body;
101. Upper box body bottom wall;
102. Upper box body side wall;
103. First cooling water trough;
104. Second cooling water trough;
105. Opening;
106. Reinforcing rib;
200. Lower box body;
201. Lower box body top wall;
202. Lower box body side wall;
203. Third cooling water trough;
204. Fourth cooling water trough;
205. Boss;
206. Receiving slot;

300. Left driving motor controller;
400. Right driving motor controller;
500. Air compressor motor controller;
501. IPM of air compressor motor controller;
600. Steering motor controller;
601. IPM of steering motor controller;
700. DC-DC voltage converter;
800. IGBT module;
801. Heat dissipation column;
901. Optical coupler sintering detector;
902. Electric leakage sensor;
903. Magnetic ring;
904. Y capacitor;
905. Battery pack interface; and
906. Charging connector interface.

DETAILED DESCRIPTION

The following describes specific implementations of the present disclosure in detail with reference to the accompanying drawings. It should be understood that the specific implementations described herein are merely used to describe and explain the present disclosure but are not intended to limit the present disclosure.

In the present disclosure, unless otherwise stated, directional terms such as "up, down, left, and right" used herein are generally defined based on drawing directions of corresponding drawings, and "inner and outer" refer to inside and outside of a contour of a corresponding component.

Figure 1:
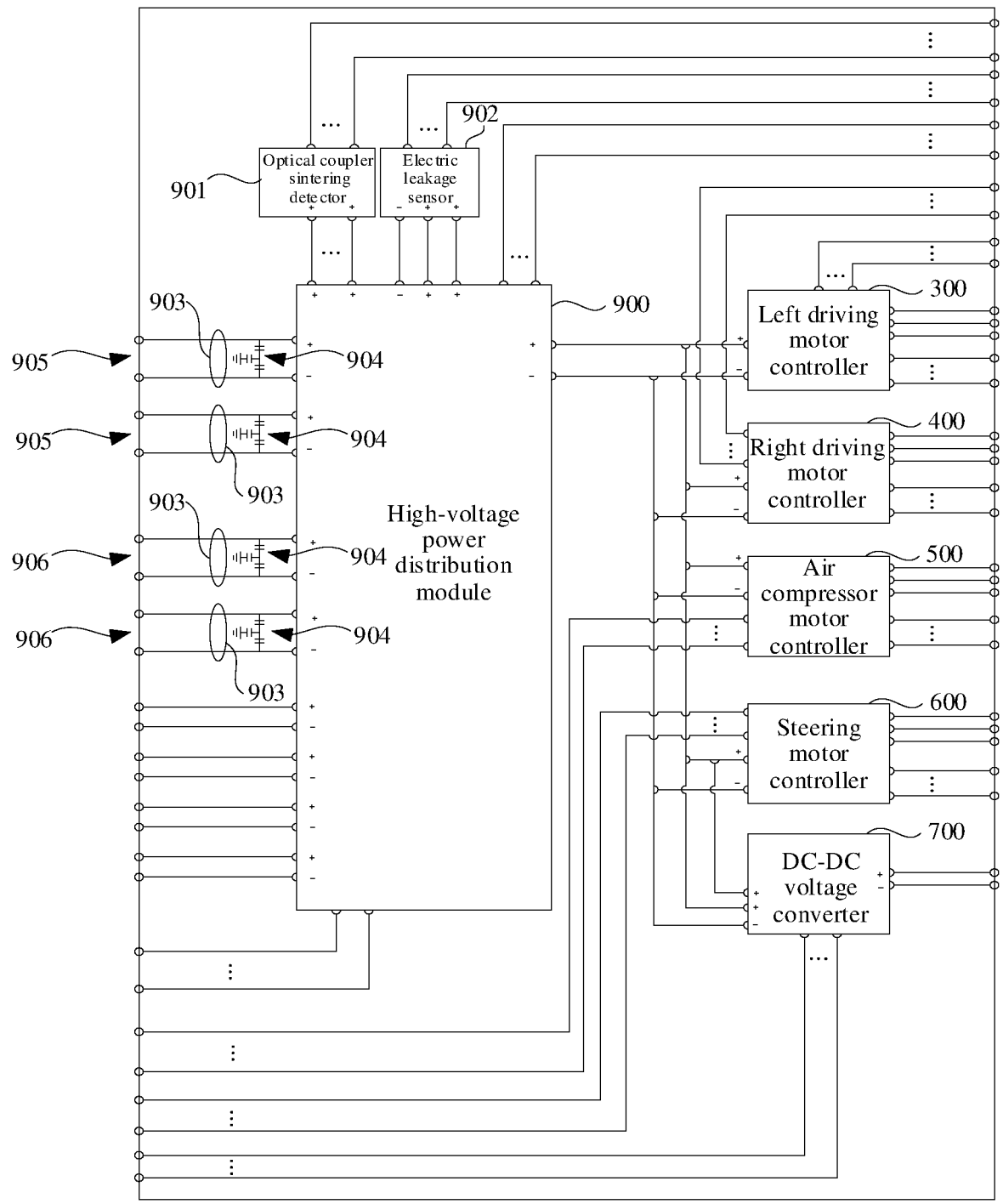
FIG. 1 is a schematic diagram of a circuit layout of an integrated controller according to an implementation of the present disclosure.
Figure 3:
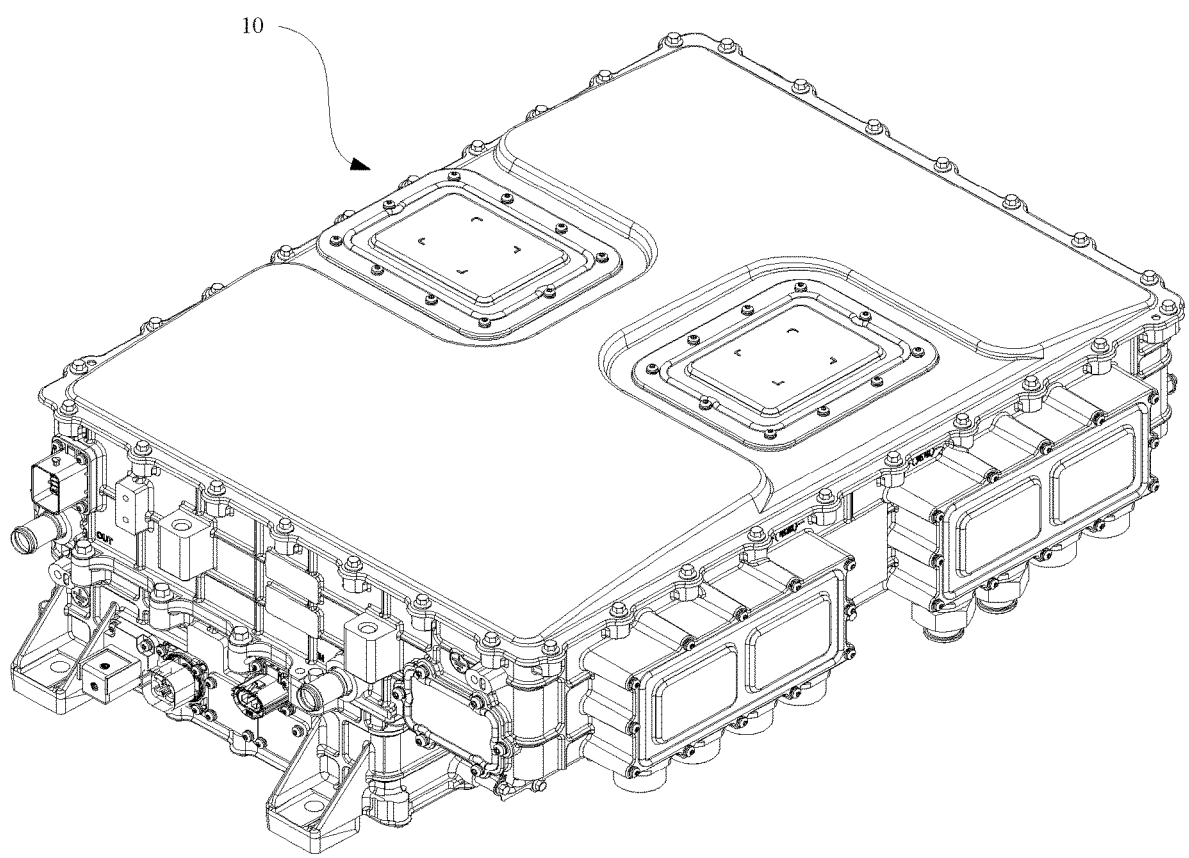
FIG. 3 is a schematic structural diagram of a box body in an integrated controller according to an implementation of the present disclosure.

FIG. 1 is a schematic diagram of a circuit layout of an integrated controller A according to one implementation of the present disclosure, and FIG. 3 is a schematic structural diagram of a box body in the integrated controller A according to one implementation of the present disclosure. As shown in FIG. 1 and FIG. 3, the integrated controller A includes a box body 10, a left driving motor controller 300, a right driving motor controller 400, an air compressor motor controller 500, a steering motor controller 600, a direct current to direct current (DC-DC) voltage converter 700, and a high-voltage power distribution module 900. The left driving motor controller 300, the right driving motor controller 400, the air compressor motor controller 500, the steering motor controller 600, the DC-DC voltage converter 700, and the high-voltage power distribution module 900 are all disposed in the box body 10.

As shown in FIG. 1 and FIG. 3, the left driving motor controller 300, the right driving motor controller 400, the air compressor motor controller 500, the steering motor controller 600, and the DC-DC voltage converter 700 are all connected to the high-voltage power distribution module 900. The box body 10 is provided with a plurality of input/output interfaces corresponding to the high-voltage power distribution module 900, the left driving motor controller 300, the right driving motor controller 400, the air compressor motor controller 500, the steering motor controller 600, and the DC-DC voltage converter 700.

Figure 2:
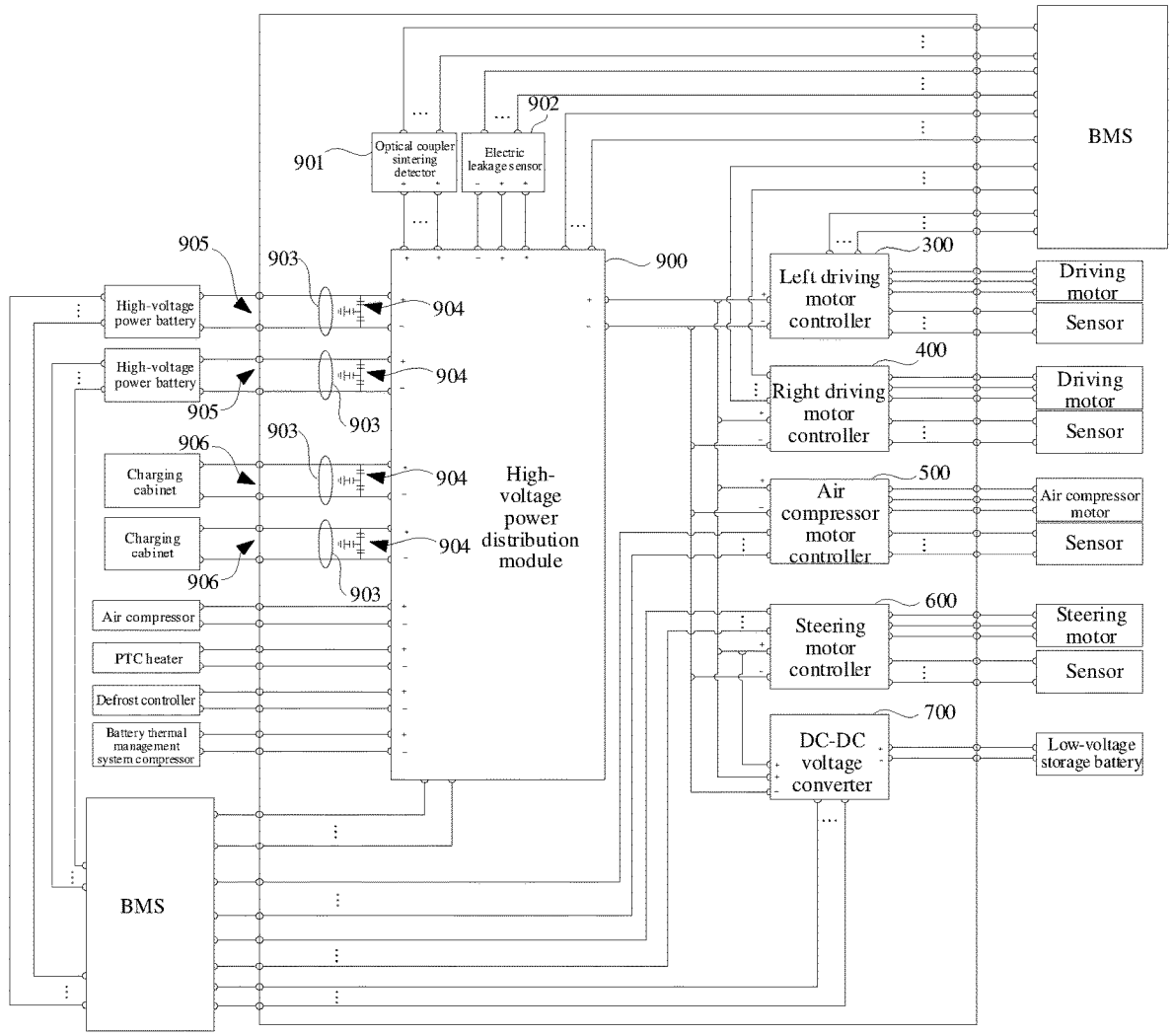
FIG. 2 is a schematic diagram of circuits of an integrated controller for whole vehicle connection according to an implementation of the present disclosure.

In some embodiments, as shown in FIG. 2, FIG. 2 is a schematic diagram of circuits for whole vehicle connection of an integrated controller according to one implementation of the present disclosure. The left driving motor controller 300, the right driving motor controller 400, the air compressor motor controller 500, the steering motor controller 600, the DC-DC voltage converter 700, and the high-voltage power distribution module 900 are connected to a Battery Management System (BMS) through the corresponding input/output interfaces on the box body 10. The left driving motor controller 300 and the right driving motor controller 400 are connected to corresponding driving motors and sensors through different input/output interfaces on the box body 10. The air compressor motor controller 500 is connected to an air compressor motor and a sensor through the input/output interfaces on the box body 10. The steering motor controller 600 is connected to a steering motor and a sensor through the input/output interfaces on the box body 10. The DC-DC voltage converter 700 is connected to a low-voltage storage battery through the input/output interface on the box body 10.

It should be noted that the number of the sensors connected to the left driving motor controller 300, the right driving motor controller 400, the air compressor motor controller 500, or the steering motor controller 600 may be one or more.

With continued reference to FIG. 2, the high-voltage power distribution module 900 may be connected to a corresponding air conditioning compressor, a Positive Temperature Coefficient (PTC) heater, a defrost controller, and a battery thermal management system compressor through different input/output interfaces on the box body 10.

As shown in FIG. 2, the box body 10 needs to be provided with the battery pack interfaces 905 and the charging connector interfaces 906, and the battery pack interfaces 905 and the charging connector interfaces 906 are all connected to the high-voltage power distribution module 900. The high-voltage power distribution module 900 needs to be connected to a high-voltage power battery through the battery pack interface 905, so that the high-voltage power battery supplies power for other modules. A charging cabinet needs to be inserted into the charging connector interface 906 through a charging connector so as to charge the high-voltage power battery.

In the integrated controller A provided by the present disclosure, integrating the left driving motor controller 300, the right driving motor controller 400, the air compressor motor controller 500, the steering motor controller 600, the DC-DC voltage converter 700, and the high-voltage power distribution module 900 in the box body optimizes the arrangement space of the whole vehicle, and reduces the development cost. These modules are all integrated in the box body 10, and may be connected through a switching copper bar, which facilitates, as compared with wire harness connection, detecting which modules are aging and reducing the cost, and also facilitates replacing the modules in the box body 10. For example, the modules corresponding to different vehicle types may be replaced for supporting dozens of types of vehicles. Therefore, the present disclosure realizes controller platformization, and resolves the technical problems in the related art of high detection cost and an increased assembly difficulty of a whole vehicle, due to that controller modules in a high-voltage system of the vehicle operate independently and are connected through a wire harness to realize the operation of the whole vehicle. In addition, integrating the left driving motor controller 300 and the right driving motor controller 400 realizes wheel drive or single motor drive of the whole vehicle.

Figure 4:
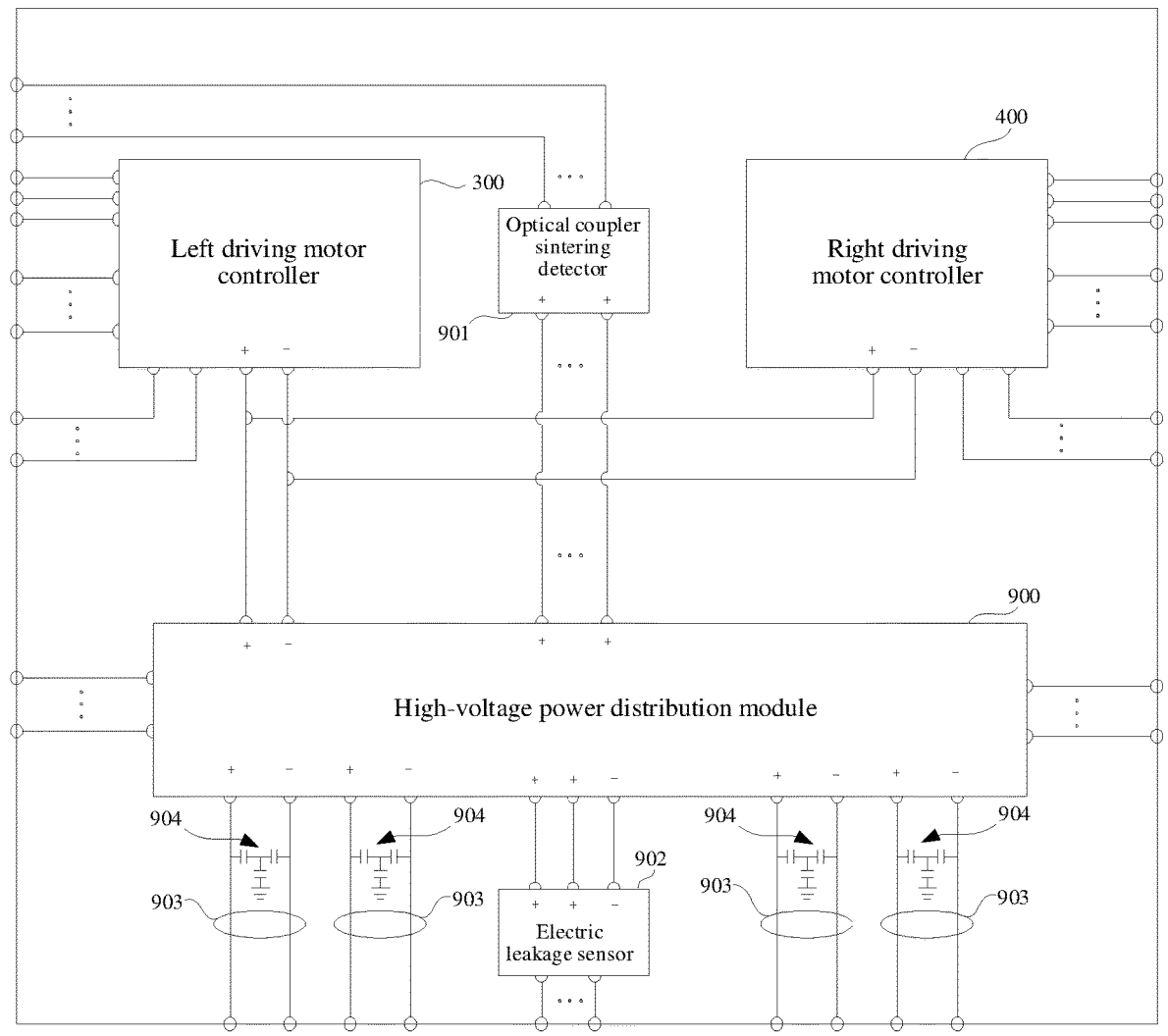
FIG. 4 is a schematic diagram of a circuit layout of an upper box body in an integrated controller according to an implementation of the present disclosure.
Figure 5:
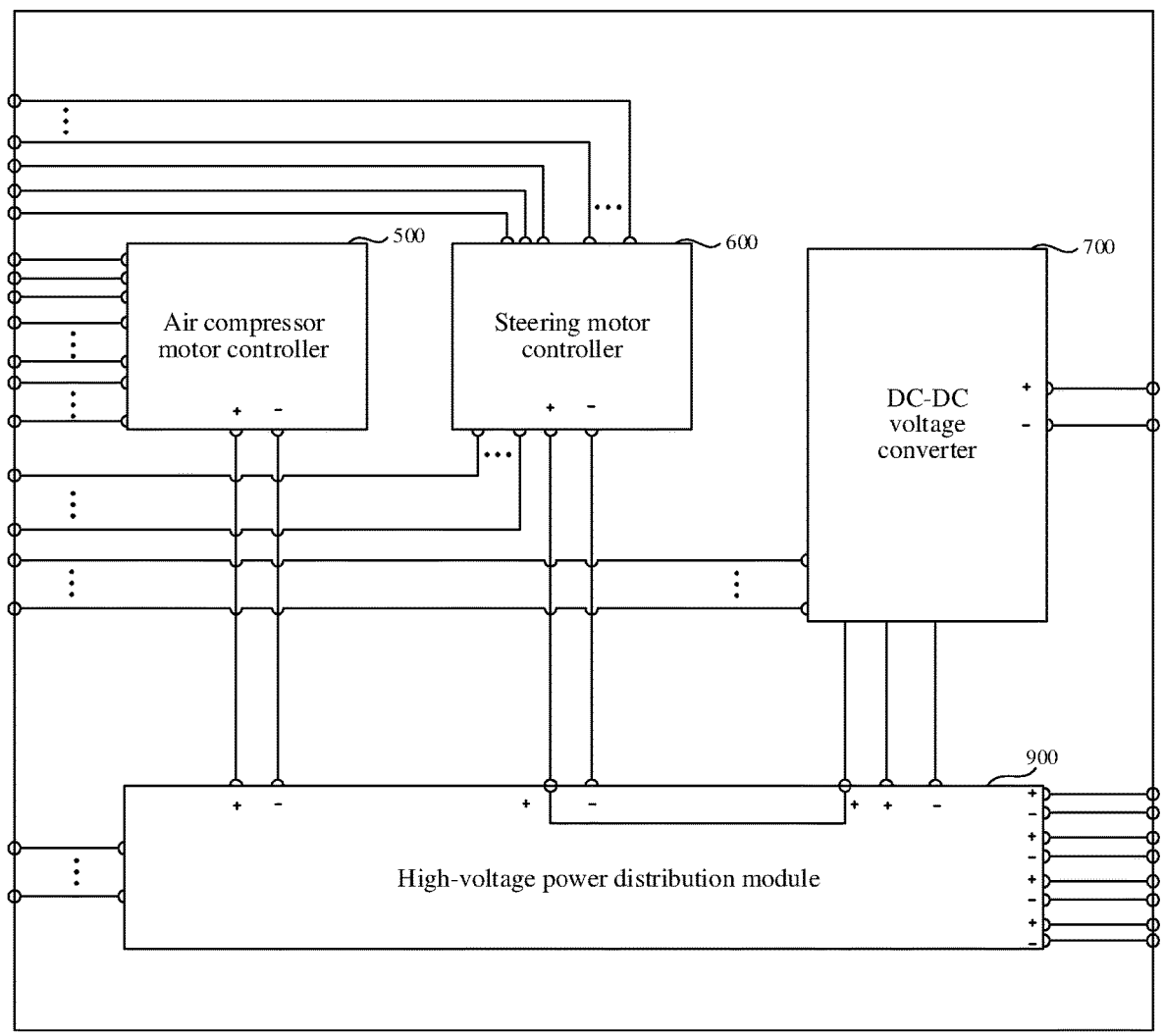
FIG. 5 is a schematic diagram of a circuit layout of a lower box body in an integrated controller according to an implementation of the present disclosure.
Figure 6:
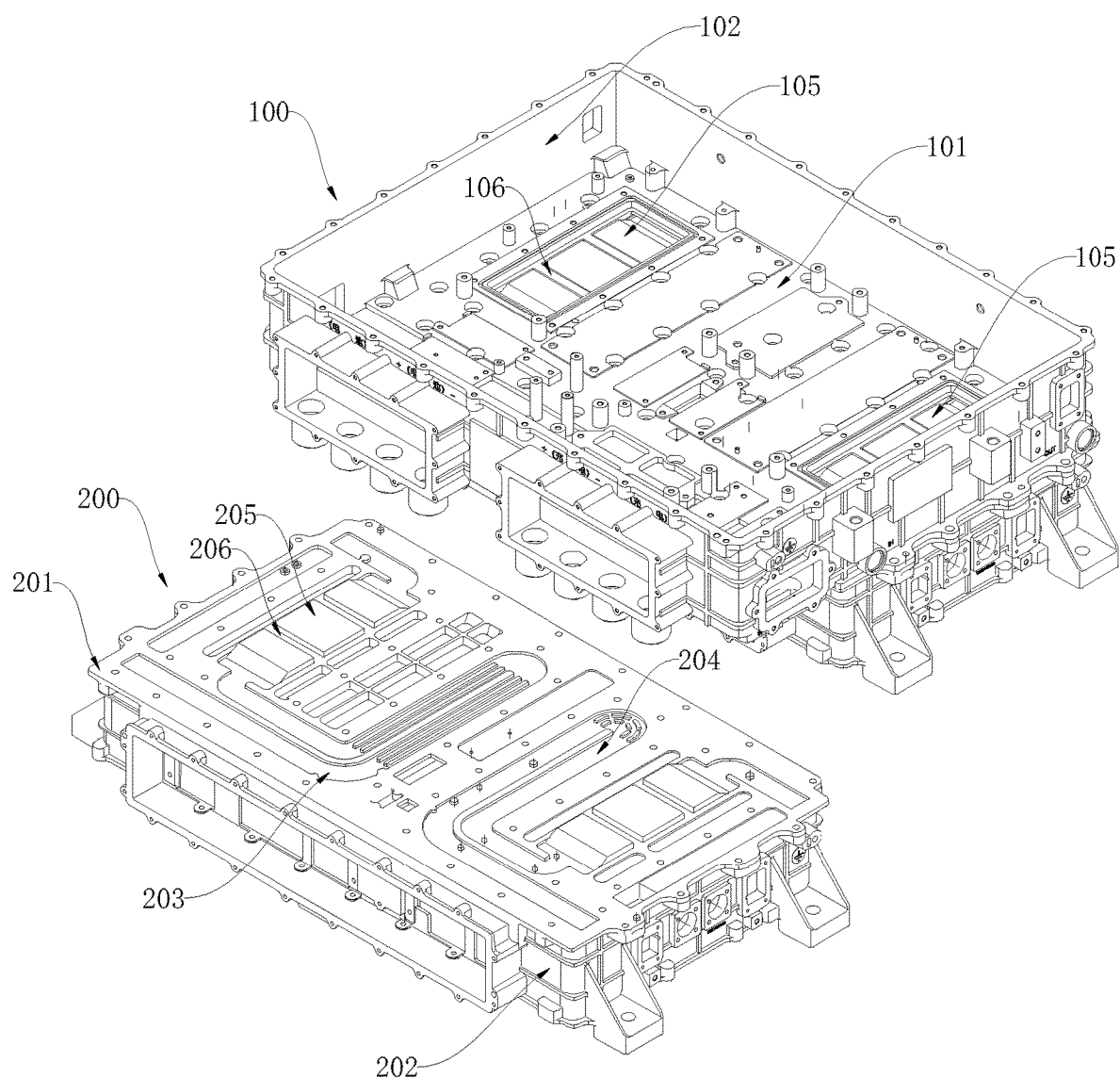
FIG. 6 is a schematic exploded view of an assembly of an upper box body and a lower box body in an integrated controller according to an implementation of the present disclosure.

Referring to FIG. 3, FIG. 4, FIG. 5, and FIG. 6, FIG. 4 is a schematic diagram of a circuit layout of an upper box body in the integrated controller A according to one implementation. FIG. 5 is a schematic diagram of a circuit layout of a lower box body in the integrated controller A according to one implementation of the present disclosure. FIG. 6 is a schematic exploded view of assembly of an upper box body and a lower box body in the integrated controller A according to one implementation of the present disclosure. As shown in FIG. 3, FIG. 4, FIG. 5, and FIG. 6, the box body 10 includes an upper box body 100 and a lower box body 200. The left driving motor controller 300 and the right driving motor controller 400 are mounted in the upper box body 100. The air compressor motor controller 500, the steering motor controller 600, and the DC-DC voltage converter 700 are mounted in the lower box body 200. The upper box body 100 and the lower box body 200 are each internally provided with the high-voltage power distribution module 900. The battery pack interfaces 905 and the charging connector interfaces 906 are all disposed in the upper box body 100.

In some embodiments, the upper box body 100 is provided with at least two battery pack interfaces 905 and at least two charging connector interfaces 906. In some embodiments provided by the accompanying drawings, the number of the battery pack interfaces 905 and the number of the charging connector interfaces 906 are two for each. The battery pack interfaces 905 are two-way interfaces, and may thus realize a single battery pack or dual battery pack operation. The charging connector interfaces 906 are two-way interfaces, and may thus realize multiple charging modes, such as dual direct-current charging, dual alternating-current charging, alternating-current and direct-current charging, single-connector direct-current charging, and single-connector alternating-current charging.

As shown in FIG. 1, FIG. 2, and FIG. 4, a connection circuit between the battery pack interfaces 905 and the high-voltage power distribution module 900, and a connection circuit between the charging connector interfaces 906 and the high-voltage power distribution module 900 are each provided with a magnetic ring 903 and a Y capacitor 904. By designing the magnetic rings 903 and the Y capacitor 904 at a charging/discharging input interface, space may be saved, and the Electro Magnetic Compatibility (EMC) is improved.

As shown in FIG. 1, FIG. 2, and FIG. 4, the upper box body 100 is further internally provided with an electric leakage sensor 902 connected to the high-voltage power distribution module 900. The upper box body 100 is provided with an input/output interface corresponding to the electric leakage sensor 902. The input/output interface is connected to the BMS. The electric leakage sensor 902 is arranged not only to provide monitoring and protection during electric leakage of the controller in the box body 10, but also to provide a protection function for sintering detection of a charging contactor.

As shown in FIG. 1, FIG. 2, and FIG. 4, the upper box body 100 is further internally provided with an optical coupler sintering detector 901 connected to the high-voltage power distribution module 900. The upper box body 100 is provided with an input/output interface corresponding to the optical coupler sintering detector 901. The input/output interface is connected to the BMS. The optical coupler sintering detector 901 is provided to achieve a sintering detection function for all contactors in the integrated controller A.

As shown in FIG. 6 to FIG. 13, the upper box body 100 is connected to the lower box body 200. A first cooling water channel A1 and a second cooling water channel A2 independent of each other are provided between the upper box body 100 and the lower box body 200. Heat of the right driving motor controller 400, the air compressor motor controller 500, and the steering motor controller 600 is dissipated through the first cooling water channel A1. Heat of the left driving motor controller 300 and the DC-DC voltage converter 700 is dissipated through the second cooling water channel A2.

In the integrated controller A provided by the present disclosure, two cooling water channels independent of each other are provided to dissipate heat for different modules on the integrated controller A. Compared with the configuration mode of a single water channel in the prior art, the use of twin water channels for cooling has at least the following three advantages. First, under the condition that the number of modules to be cooled is constant, the number of modules cooled by the coolant in each water channel is reduced, thereby avoiding, to a certain extent, the loss of cooling effect due to a high coolant temperature, and ensuring effective cooling for each module to be cooled. Second, the circulation path of each water channel is shortened, which reduces pressure loss during a flow process of the coolant, thereby reducing a requirement for a water pump, i.e., allowing to use a water pump having a lower pressure and flow rate. In addition, the shortening of the circulation path may also shorten a circulation duration of a high temperature coolant in the integrated controller A, thereby avoiding the rise of the temperature of the whole integrated controller A. Third, a flow area of each water channel is reduced and the circulation path is shortened, which reduces the difficulty of sealing the water channel, thereby reducing the risk of water leakage of the water channel.

The upper box body 100 and the lower box body 200 may be formed in any suitable structure and shape. In one implementation, as shown in FIG. 6, the upper box body 100 includes an upper box body bottom wall 101 and an upper box body side wall 102 formed around the upper box body bottom wall 101. A first cooling water trough 103 and a second cooling water trough 104 independent of each other are formed on a lower surface of the upper box body bottom wall 101. The lower box body 200 includes a lower box body top wall 201 and a lower box body side wall 202 formed around the lower box body top wall 201. A third cooling water trough 203 and a fourth cooling water trough 204 independent of each other are formed on an upper surface of the lower box body top wall 201. The lower surface of the upper box body bottom wall 101 is attached to the upper surface of the lower box body top wall 201, so that the first cooling water trough 103 and the fourth cooling water trough 204 together define the first cooling water channel A1, and the second cooling water trough 104 and the third cooling water trough 203 together define the second cooling water channel A2.

In this implementation, by taking full use of the structures of the upper box body bottom wall 101 and the lower box body top wall 201, the first cooling water channel A1 and the second cooling water channel A2 independent of each other are defined by forming water troughs on the upper box body bottom wall 101 and the lower box body top wall 201, thereby avoiding individual machining of cooling water channels on the box body, saving space, and facilitating the arrangement of other parts in the integrated controller A. In other alternative implementations, the first cooling water channel A1 and the second cooling water channel A2 may be separately disposed on the upper box body bottom wall 101 or the lower box body top wall 201. Alternatively, one of the first cooling water channel A1 and the second cooling water channel A2 may be separately formed on the upper box body bottom wall 101, and the other one may be separately formed on the lower box body top wall 201. Alternatively, two independent water pipes may be separately provided, the two water pipes are fixed on the box body of the integrated controller A through fastening members, and the first cooling water channel A1 and the second cooling water channel A2 are respectively defined in the two water pipes.

In order to achieve a reliable connection between the upper box body 100 and the lower box body 200, and improve the sealing performance of the first cooling water channel A1 and the second cooling water channel A2, in one implementation, the upper box body 100 and the lower box body 200 are connected through bolts and friction welding.

In the present disclosure, elements to be cooled in the left driving motor controller 300 and the right driving motor controller 400 are mainly Insulated Gate Bipolar Transistor (IGBT) modules, and elements to be cooled in the air compressor motor controller 500 and the steering motor controller 600 are Intelligent Power Modules (IPM). Heat dissipation of the IGBT modules is generally implemented through direct contact with the coolant, and heat dissipations of an IPM 501 of the air compressor motor controller 500 and an IPM 601 of the steering motor controller 600 are generally implemented through contact with walls of cooling pipes. Therefore, in one implementation of the present disclosure, during mounting, the air compressor motor controller 500, the steering motor controller 600, and the DC-DC voltage converter 700 are in contact with the lower box body top wall 201. In this way, when the coolant flows on the lower box body top wall 201, the three modules may exchange heat with the coolant through the lower box body top wall 201, to achieve the purpose of heat dissipation and cooling.

In addition, as shown in FIG. 6, FIG. 7, FIG. 11, and FIG. 13, two openings 105 running through the upper box body bottom wall 101 are formed in the upper box body bottom wall 101. The left driving motor controller 300 is disposed on one opening 105, so that a heat dissipation column of the left driving motor controller 300 (a heat dissipation column 801 of the IGBT module) is in contact with the coolant in the second cooling water channel A2. The right driving motor controller 400 is disposed on the other opening 105, so that a heat dissipation column of the right driving motor controller 400 is contact with the coolant in the first cooling water channel A1.

Figure 7:
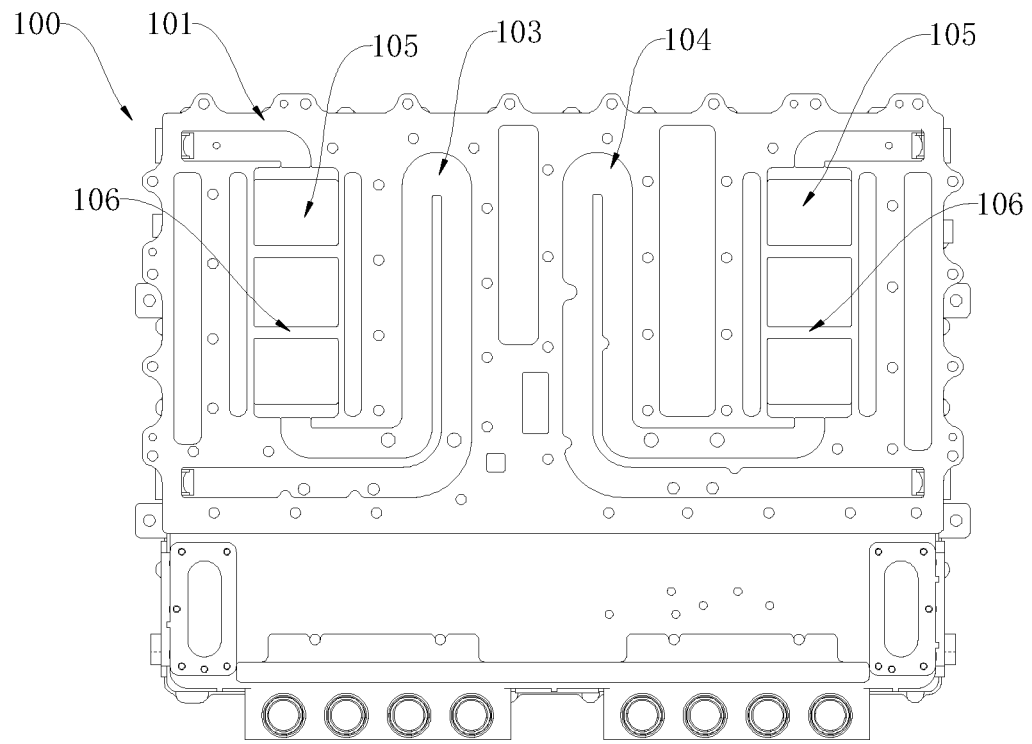
FIG. 7 is a bottom schematic view of an upper box body according to an implementation of the present disclosure.

As shown in FIG. 6 and FIG. 7, a reinforcing rib 106 may be formed in the opening 105, two ends of the reinforcing rib 106 are connected to a pair of side edges of the opening 105, and the reinforcing rib 106 is perpendicular to a flow direction of the coolant.

Figure 8:
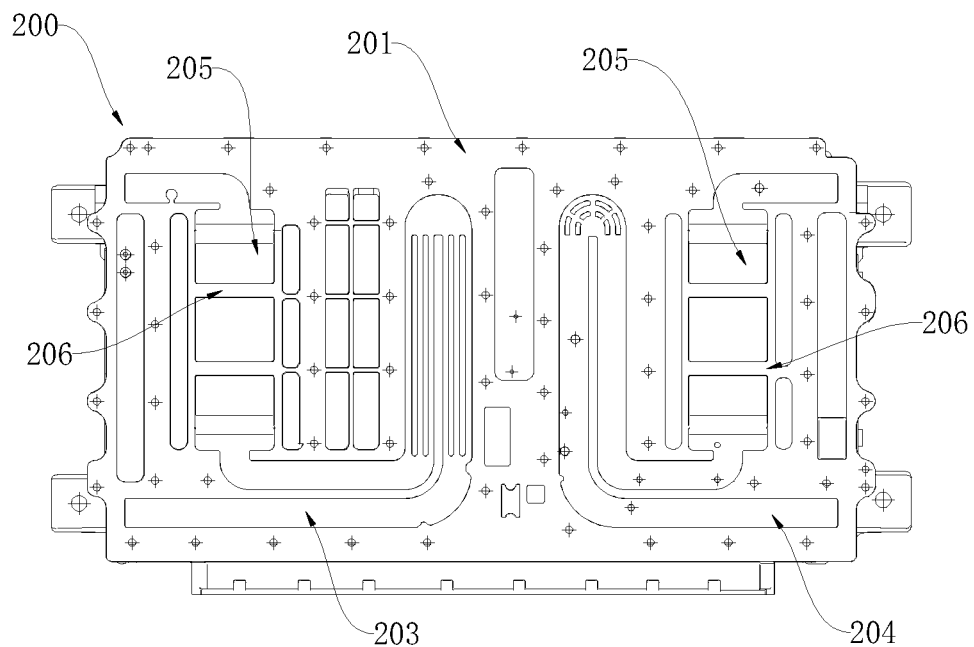
FIG. 8 is a top schematic view of a lower box body according to an implementation of the present disclosure.
Figure 9:
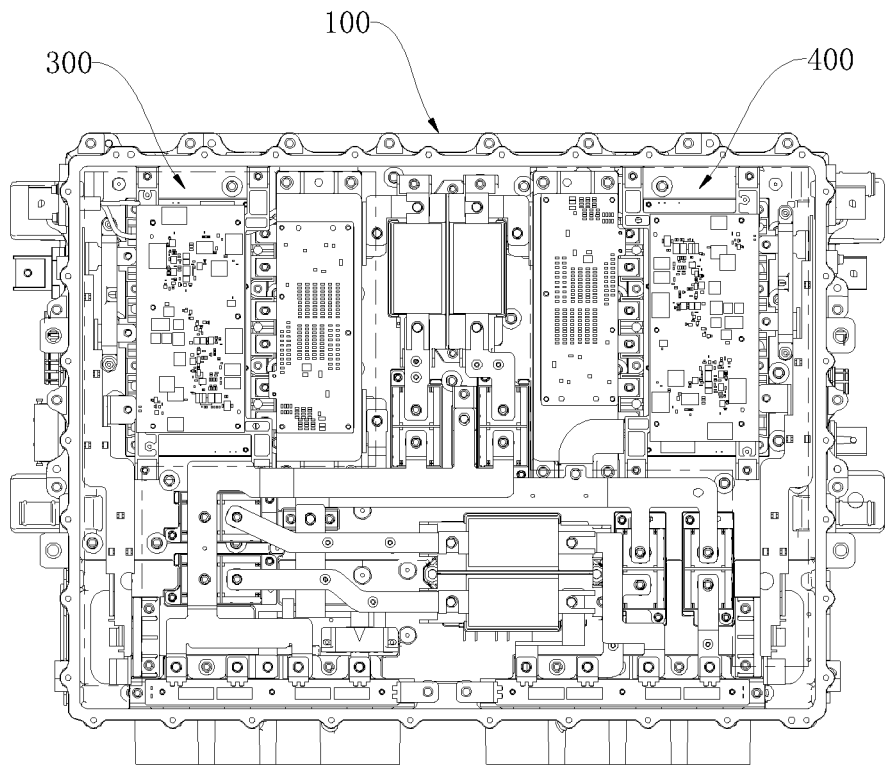
FIG. 9 is a top schematic view of an upper box body according to an implementation of the present disclosure, where the top wall of the upper box body is not shown, but the left driving motor controller and the right driving motor controller are shown.
Figure 10:
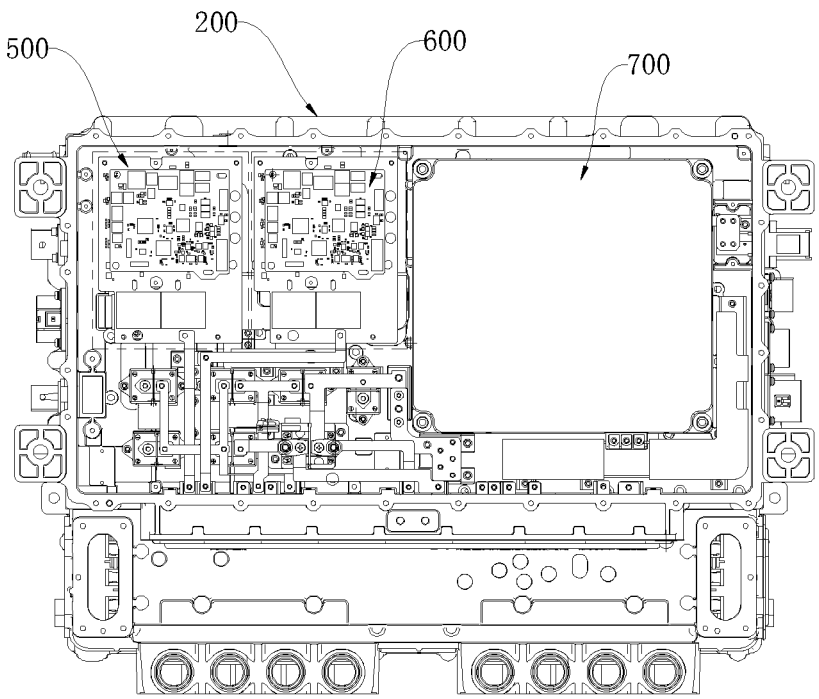
FIG. 10 is a bottom schematic view of a lower box body according to an implementation of the present disclosure, where a bottom wall of a lower box body is not shown, but an air compressor motor controller, a steering motor controller, and a DC-DC voltage converter are shown.
Figure 11:
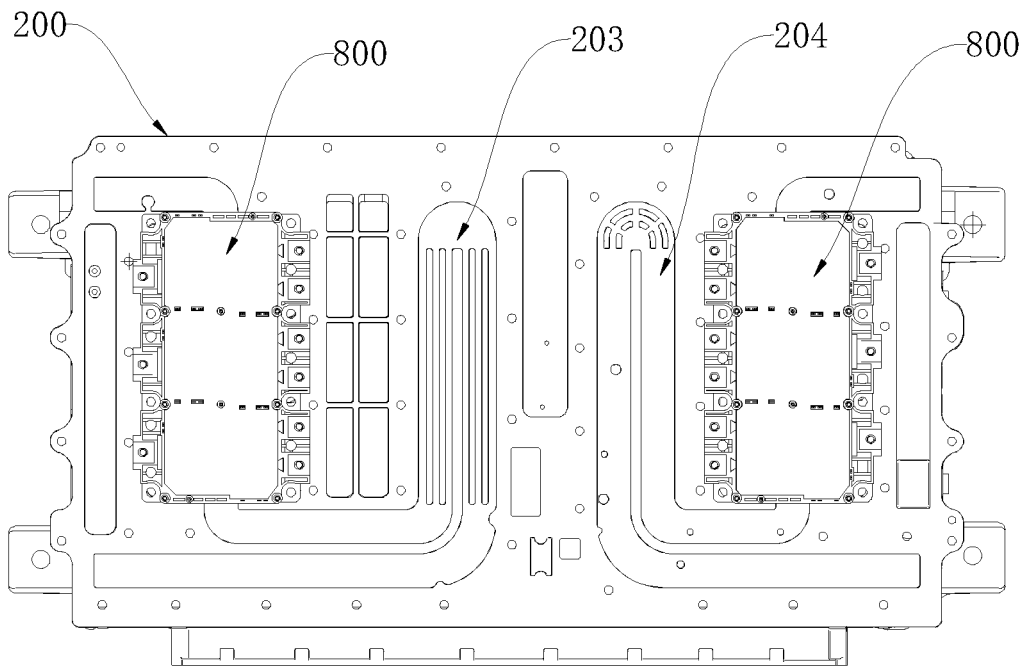
FIG. 11 is a top schematic view of a lower box body according to an implementation of the present disclosure, where an IGBT module of a left driving motor controller and an IGBT module of a right driving motor controller are shown.
Figure 12:
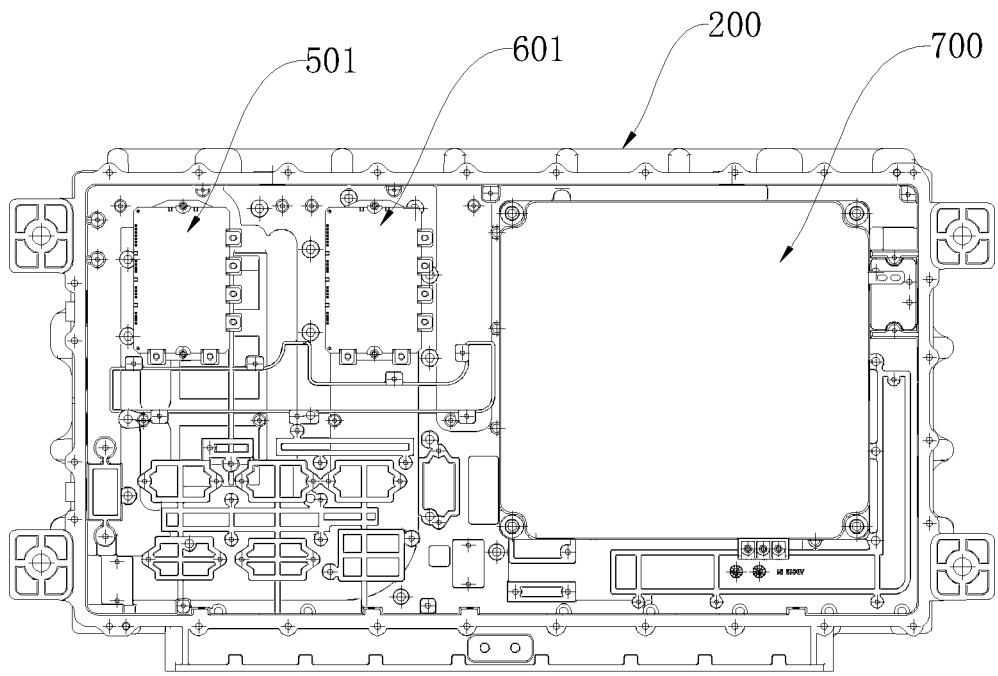
FIG. 12 is a bottom schematic view of a lower box body according to an implementation of the present disclosure, where an IPM module of an air compressor motor controller, an IPM module of a steering motor controller, and a DC-DC voltage converter are shown.
Figure 13:
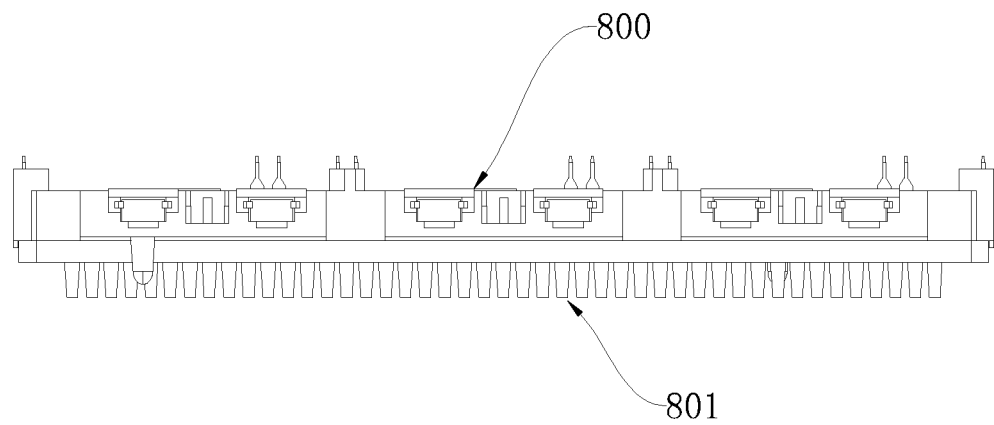
FIG. 13 is a schematic structural diagram of an IGBT module in an integrated controller according to an implementation of the present disclosure.

As shown in FIG. 6 and FIG. 8, a boss 205 is formed on the upper surface of the lower box body top wall 201 at a position corresponding to the opening 105. A shape of the boss 205 fits that of the opening 105. A receiving slot 206 for receiving the reinforcing rib 106 is formed on the boss 205. In this way, after the upper box body bottom wall 101 is attached to the lower box body top wall 201, the boss 205 is inserted into the opening 105, the reinforcing rib 106 is inserted into the receiving slot 206, and an upper surface of the reinforcing rib 106 is flush with an upper surface of the boss 205. In this case, the heat dissipation column 801 of the IGBT module is placed on the boss 205, and the coolant flows in a gap between a plurality of heat dissipation columns 801, thereby achieving the heat exchange.

Herein, by providing the reinforcing rib 106, at one hand, the structural strength of the upper box body bottom wall 101 is improved to satisfy strength requirements for mounting parts, such as the left driving motor controller 300 and the right driving motor controller 400. At the other hand, the reinforcing rib 106 is perpendicular to the flow direction of the coolant, and thus achieve the function of blocking the coolant at a lower layer, thereby increasing an allowable amount at which a width of the boss 205 is less than that of the opening 105. In other words, if there is no the reinforcing rib 106, in order to prevent the coolant from rapidly flowing through gaps between left and right side walls of the boss 205 and left and right side walls of the opening 105 thereby reducing the cooling effect of the coolant on the IGBT module, the width of the boss 205 is generally increased as much as possible to reduce the gaps. In the present disclosure, due to the presence of the reinforcing rib 106, even though the width of the boss 205 is much less than that of the opening 105, the coolant does not flow through the gaps between the left and right side walls of the boss 205 and the left and right side walls of the opening 105, thereby improving the cooling effect of the coolant on the IGBT module.

In order to maximally cool the parts to be cooled and improve the cooling efficiency, in one implementation of the present disclosure, the coolant in the first cooling water channel A1 may first cool the steering motor controller 600, and then cool the air compressor motor controller 500 and the right driving motor controller 400, i.e., making the coolant first cool the steering motor controller 600 having a lower heat amount, and finally cool the right driving motor controller 400 having a higher heat amount. The benefit of this is that the temperature of the coolant does not rise significantly after flowing through the steering motor controller 600, and the coolant is still capable of achieving an effective cooling effect in a process of flowing through the air compressor motor controller 500 and the right driving motor controller 400. Similarly, the coolant in the second cooling water channel A2 first cools the DC-DC voltage converter 700 having a lower heat amount, and then cools the left driving motor controller 300 having a higher heat amount.

In the present disclosure, cross-sectional shapes of the first cooling water channel A1 and the second cooling water channel A2, and positions thereof on the box body of the integrated controller A may be flexibly set according to structures and positions of surrounding parts, and no limitation is made thereto in the present disclosure. In one implementation, in order to facilitate machining, cross-sections of the first cooling water channel A1 and the second cooling water channel A2 may be rectangular. In order to facilitate arranging other parts, the first cooling water channel A1 and the second cooling water channel A2 may be symmetrically arranged on an attachment surface between the upper box body 100 and the lower box body 200.

It should further be noted that in the integrated controller A provided by the present disclosure, integrating the left driving motor controller 300, the right driving motor controller 400, the air compressor motor controller 500, the steering motor controller 600, the DC-DC voltage converter 700, and the high-voltage power distribution module 900 in the box body 10 enables wearing parts in the high-voltage power distribution module 900, such as a discharging fuse, a main fuse, a small power distribution fuse, and a pre-charging resistor, to be replaced on the whole vehicle without returning the integrated controller to a manufacturer for replacement, thereby further saving the costs.

Figure 14:
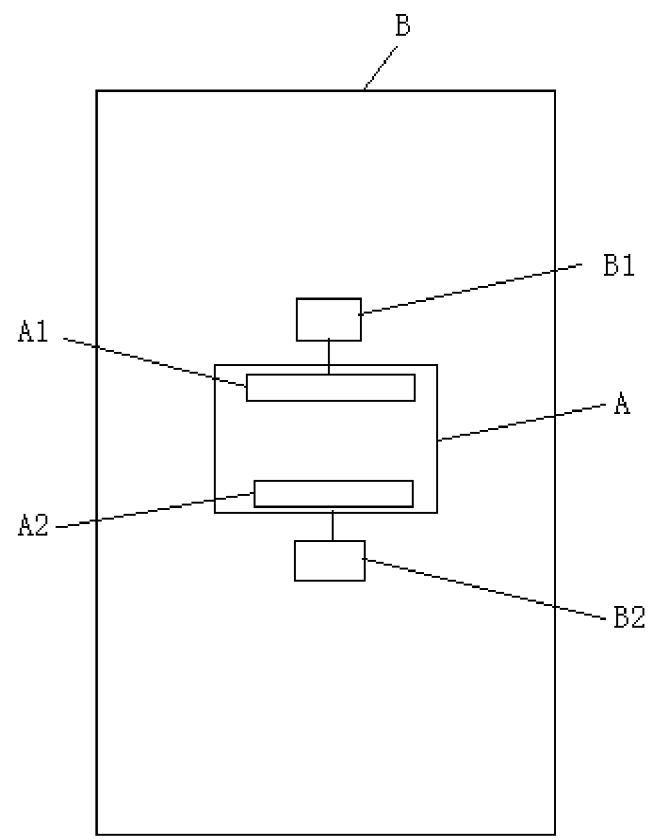
FIG. 14 is a schematic diagram of a vehicle according to an implementation of the present disclosure.

With reference to FIG. 14, the present disclosure further provides a vehicle B. The vehicle B includes the integrated controller A above. In some embodiments, the vehicle B further includes a first water pump B1 and a second water pump B2. The first water pump B1 is configured to drive the coolant in the first cooling water channel A1 to circulate, and the second water pump B2 is configured to drive the coolant in the second cooling water channel A2 to circulate. Compared with a method of providing only a single water pump, providing two separate water pumps avoids a cooling failure of the integrated controller A due to the fault of a single water pump, thereby improving the reliability of normal operation of the whole vehicle.

The preferred implementations of the present disclosure are described in detail above with reference to the accompanying drawings, but the present disclosure is not limited to the specific details in the above implementations. Various simple variations may be made to the technical solutions of the present disclosure within the scope of the technical idea of the present disclosure, and such simple variations shall all fall within the protection scope of the present disclosure.

It should be further noted that the specific technical features described in the above specific implementations may be combined in any suitable manner provided that no conflict occurs. To avoid unnecessary repetition, various possible combination manners are not further described in the present disclosure.

In addition, various different implementations of the present disclosure may alternatively be combined randomly. Such combinations should also be considered as the content disclosed in the present disclosure provided that these combinations do not depart from the idea of the present disclosure.

What is claimed is:

1. An integrated controller for a vehicle, comprising a box body, a high-voltage power distribution module disposed in the box body, and a left driving motor controller, a right driving motor controller, an air compressor motor controller, a steering motor controller, and a direct current to direct current (DC-DC) voltage converter that are all connected to the high-voltage power distribution module, wherein
   the box body comprises an upper box body, a lower box body, and a plurality of input/output interfaces respectively corresponding to the high-voltage power distribution module, the left driving motor controller, the right driving motor controller, the air compressor motor controller, the steering motor controller, and the DC-DC voltage converter,
   the left driving motor controller and the right driving motor controller are mounted in the upper box body,
   the air compressor motor controller, the steering motor controller, and the DC-DC voltage converter are mounted in the lower box body,
   the high-voltage power distribution module is disposed in the upper box body and the lower box body, and
   the upper box body comprises battery pack interfaces and charging connector interfaces that are all connected to the high-voltage power distribution module.

2. The integrated controller according to claim 1, wherein the upper box body comprises at least two battery pack interfaces and at least two charging connector interfaces.

3. The integrated controller according to claim 2, wherein each of a connection circuit between the at least two battery pack interfaces and the high-voltage power distribution module and a connection circuit between the at least two charging connector interfaces and the high-voltage power distribution module comprises a magnetic ring and a Y capacitor.

4. The integrated controller according to claim 1, wherein an electric leakage sensor is disposed in the upper box body and connected to the high-voltage power distribution module, and the upper box body comprises an input/output interface corresponding to the electric leakage sensor.

5. The integrated controller according to claim 1, wherein an optical coupler sintering detector is disposed in the upper box body and connected to the high-voltage power distribution module, and the upper box body comprises an input/output interface corresponding to the optical coupler sintering detector.

6. The integrated controller according to claim 1, wherein
   a first cooling water channel and a second cooling water channel independent from each other are disposed between the upper box body and the lower box body;
   heat of the right driving motor controller, the air compressor motor controller, and the steering motor controller is dissipated through the first cooling water channel; and
   heat of the left driving motor controller and the DC-DC voltage converter is dissipated through the second cooling water channel.

7. The integrated controller according to claim 6, wherein
   the upper box body comprises an upper box body bottom wall and an upper box body side wall formed around the upper box body bottom wall;
   a first cooling water trough and a second cooling water trough independent from each other are formed on a lower surface of the upper box body bottom wall;
   the lower box body comprises a lower box body top wall and a lower box body side wall formed around the lower box body top wall;
   a third cooling water trough and a fourth cooling water trough independent from each other are formed on an upper surface of the lower box body top wall; and
   the lower surface of the upper box body bottom wall is attached to the upper surface of the lower box body top wall, so that the first cooling water trough and the fourth cooling water trough together form the first cooling water channel, and the second cooling water trough and the third cooling water trough together form the second cooling water channel.

8. The integrated controller according to claim 1, wherein the upper box body and the lower box body are connected through bolts and friction welding.

9. The integrated controller according to claim 7, wherein the air compressor motor controller, the steering motor controller, and the DC-DC voltage converter are in contact with the lower box body top wall.

10. The integrated controller according to claim 7, wherein
    at least two openings running through the upper box body bottom wall are formed in the upper box body bottom wall;
    the left driving motor controller is disposed on one of the at least two openings, so that a heat dissipation column of the left driving motor controller is in contact with a coolant in the second cooling water channel; and
    the right driving motor controller is disposed on the other one of the at least two openings, so that a heat dissipation column of the right driving motor controller is in contact with a coolant in the first cooling water channel.

11. The integrated controller according to claim 10, wherein
    at least one reinforcing rib is formed in each of the at least two openings;
    two ends of the at least one reinforcing rib are connected to a pair of side edges of each of the at least two openings; and
    the at least one reinforcing rib is perpendicular to a flow direction of each coolant.

12. The integrated controller according to claim 11, wherein a boss is formed on the upper surface of the lower box body top wall at a position corresponding to one of the at least two openings;

a shape of the boss fits that of each of the at least two openings; and a receiving slot for receiving the at least one reinforcing rib is formed on the boss.

13. The integrated controller according to claim 6, wherein a coolant in the first cooling water channel cools the steering motor controller, and subsequently cools the air compressor motor controller and the right driving motor controller; and a coolant in the second cooling water channel cools the DC-DC voltage converter, and subsequently cools the left driving motor controller.

14. The integrated controller according to claim 6, wherein the first cooling water channel and the second cooling water channel are symmetrically arranged.

* * * * *